United States Patent
Okamura et al.

(10) Patent No.: US 11,923,220 B2
(45) Date of Patent: Mar. 5, 2024

(54) SUBSTRATE PROCESSING APPARATUS

(71) Applicant: TOKYO ELECTRON LIMITED, Tokyo (JP)

(72) Inventors: Naoyuki Okamura, Kumamoto (JP); Hirotaka Maruyama, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 713 days.

(21) Appl. No.: 16/964,247

(22) PCT Filed: Jan. 16, 2019

(86) PCT No.: PCT/JP2019/000985
§ 371 (c)(1),
(2) Date: Jul. 23, 2020

(87) PCT Pub. No.: WO2019/146456
PCT Pub. Date: Aug. 1, 2019

(65) Prior Publication Data
US 2021/0043482 A1 Feb. 11, 2021

(30) Foreign Application Priority Data

Jan. 26, 2018 (JP) ................................. 2018-011845

(51) Int. Cl.
*H01L 21/67* (2006.01)
*B05C 11/10* (2006.01)
*G01N 21/95* (2006.01)

(52) U.S. Cl.
CPC .... *H01L 21/67253* (2013.01); *B05C 11/1002* (2013.01); *G01N 21/9501* (2013.01); *H01L 21/67023* (2013.01); *H01L 21/67288* (2013.01)

(58) Field of Classification Search
None
See application file for complete search history.

(56) References Cited

U.S. PATENT DOCUMENTS 5,206,627 A * 4/1993 Kato ................ H01L 21/67265
340/568.1
6,647,642 B2 * 11/2003 Kamikawa ........ H01L 21/67051
34/232
(Continued)

FOREIGN PATENT DOCUMENTS

JP 2003-273003 A 9/2003
JP 2004-363229 A 12/2004
(Continued)

OTHER PUBLICATIONS

International Search Report dated Feb. 26, 2019 for WO 2019/146456 A1 (4 pages).

*Primary Examiner* — Jethro M. Pence
(74) *Attorney, Agent, or Firm* — Venjuris, P.C.

(57) ABSTRACT

A substrate processing apparatus includes: a processing chamber; a substrate holder that is disposed in the processing chamber and holds a substrate; a processing liquid supply that supplies a processing liquid to the substrate held in the substrate holder; an infrared camera that acquires an infrared image of the processing chamber; and a controller that detects at least a state of the processing liquid based on the infrared image and monitors presence/absence of an abnormality.

21 Claims, 6 Drawing Sheets

(56) References Cited

U.S. PATENT DOCUMENTS

| | | | |
|---|---|---|---|
| 6,776,173 B2* | 8/2004 | Kamikawa | H01L 21/67303 134/158 |
| 6,792,958 B2* | 9/2004 | Kamikawa | H01L 21/67017 134/186 |
| 6,869,499 B2* | 3/2005 | Toshima | B08B 7/00 156/345.33 |
| 7,530,749 B2* | 5/2009 | Yamamoto | H01L 21/67034 396/611 |
| 7,609,361 B2* | 10/2009 | Araki | G03F 7/70925 355/53 |
| 7,681,521 B2* | 3/2010 | Nishibayashi | H01L 21/6715 118/712 |
| 7,855,784 B2* | 12/2010 | Okita | G03F 7/7065 356/400 |
| 8,326,468 B2* | 12/2012 | Kondoh | H01L 21/67766 414/935 |
| 8,591,224 B2* | 11/2013 | Dong-Hun | H01L 21/67017 219/390 |
| 8,654,325 B2* | 2/2014 | Nakamizo | H01L 21/67259 356/237.1 |
| 8,817,225 B2* | 8/2014 | Matsuoka | G03F 7/16 118/52 |
| 8,858,754 B2* | 10/2014 | Horiguchi | H01J 37/3244 156/345.43 |
| 8,888,387 B2* | 11/2014 | Matsuoka | H01L 21/6715 396/611 |
| 8,985,880 B2* | 3/2015 | Matsuoka | H01L 21/6715 396/611 |
| 9,224,283 B2* | 12/2015 | Kaneko | G05B 23/027 |
| 9,417,529 B2* | 8/2016 | Matsuoka | G03F 7/16 |
| 9,460,947 B2* | 10/2016 | Matsuoka | G03F 7/162 |
| 9,721,814 B2* | 8/2017 | Sato | H01L 21/67253 |
| 9,887,106 B2* | 2/2018 | Furukawa | H01L 21/67023 |
| 9,960,063 B2* | 5/2018 | Hayashi | H01L 21/67259 |
| 10,155,246 B2* | 12/2018 | Tomita | B05D 1/02 |
| 10,474,139 B2* | 11/2019 | Takimoto | G05B 19/41875 |
| 10,665,487 B2* | 5/2020 | Kobata | H01L 21/6838 |
| 10,916,472 B2* | 2/2021 | Clark | H01L 22/12 |
| 11,101,173 B2* | 8/2021 | Clark | H01L 21/76849 |
| 11,139,181 B2* | 10/2021 | Inadomi | H01L 21/67178 |
| 11,430,673 B2* | 8/2022 | Hashimoto | G03F 7/42 |
| 11,450,544 B2* | 9/2022 | Kobata | B24B 37/04 |
| 11,574,827 B2* | 2/2023 | Iino | H01L 21/304 |
| 11,597,607 B2* | 3/2023 | Oh | H01L 21/67393 |
| 11,604,150 B2* | 3/2023 | Okuzono | H01L 21/304 |
| 11,664,254 B2* | 5/2023 | Watanabe | G03F 7/16 414/806 |
| 11,676,844 B2* | 6/2023 | Kiyotomi | H01L 21/6708 427/256 |
| 11,715,656 B2* | 8/2023 | Chang | H01L 21/67017 438/8 |
| 11,752,515 B2* | 9/2023 | Kajiwara | B05B 12/04 118/313 |
| 2012/0034369 A1* | 2/2012 | Ito | G03F 7/16 118/712 |
| 2015/0251398 A1* | 9/2015 | Deguchi | H01L 21/681 156/349 |
| 2020/0006100 A1* | 1/2020 | Clark | H01L 21/67248 |
| 2020/0043764 A1* | 2/2020 | Clark | G05B 19/4189 |
| 2020/0083070 A1* | 3/2020 | Clark | H01L 21/0228 |
| 2020/0083080 A1* | 3/2020 | Clark | H01L 21/67161 |
| 2021/0043482 A1* | 2/2021 | Okamura | H01L 21/67023 |
| 2021/0285822 A1* | 9/2021 | Carcasi | H01L 21/6715 |
| 2022/0076968 A1* | 3/2022 | Marumoto | H01L 21/6732 |
| 2022/0165597 A1* | 5/2022 | Watanabe | G03F 7/168 |
| 2022/0254658 A1* | 8/2022 | Fukui | H01L 21/67742 |
| 2022/0284562 A1* | 9/2022 | Benvegnu | G06T 7/10 |
| 2022/0375775 A1* | 11/2022 | Kobata | B24B 37/04 |
| 2022/0395874 A1* | 12/2022 | Takahashi | H01L 21/68728 |
| 2023/0264233 A1* | 8/2023 | Kosai | H01L 21/67017 210/805 |
| 2023/0307270 A1* | 9/2023 | Marumoto | H01L 21/67242 438/758 |
| 2023/0326772 A1* | 10/2023 | Chang | H01L 21/67253 438/8 |

FOREIGN PATENT DOCUMENTS

| | | |
|---|---|---|
| JP | 2007-273792 A | 10/2007 |
| JP | 2009-181982 A | 8/2009 |
| JP | 2015-191895 A | 11/2015 |
| KR | 10-2011-0128231 A | 11/2011 |
| KR | 10-2012-0047825 A | 5/2012 |

* cited by examiner

SUBSTRATE PROCESSING APPARATUS

CROSS REFERENCE TO RELATED APPLICATIONS

This application is a national phase of PCT application No. PCT/JP2019/000985, filed on 16 Jan. 2019, which claims priority from Japanese Patent Application No. 2018-011845, filed on 26 Jan. 2018, all of which are incorporated herein by reference.

TECHNICAL FIELD

The present disclosure relates to a substrate processing apparatus that performs a liquid processing on a substrate.

BACKGROUND

During a liquid processing of a substrate, the positional deviation of a nozzle that ejects the processing liquid, dripping of the liquid from the nozzle, splash of the liquid of the substrate, or the like may cause a product defect. As a result, it may be required that a substrate processing apparatus is equipped with the function of monitoring the presence/absence of the abnormalities.

As for such an abnormality detection technology, for example, a method is known in which the nozzle position is monitored by an encoder that detects the position of a drive arm to which the nozzle is attached. Further, a technology is known in which the ejection state of the processing liquid is captured by a charge-coupled device (CCD) sensor, and the ejection amount of the processing liquid is monitored by performing an imaging processing on the captured image (see, Patent Document 1).

PRIOR ART DOCUMENT

Patent Document

Patent Document 1: Japanese Patent Laid-Open Publication No. 2003-273003

SUMMARY OF THE INVENTION

Problem to be Solved

However, in the technology in the related art, the presence/absence of an abnormality that may cause a product defect may not be appropriately monitored. For example, in case of monitoring the position of the drive arm by the encoder, when a problem such as loosening of a screw of the driving unit occurs, the actual position of the drive arm may be deviated from the position indicated by the encoder value.

Further, since the captured image used in the device disclosed in Patent Document 1 is a visible light image, the monitoring technology disclosed in Patent Document 1 may not be used in principle under the situation where the substrate is not illuminated with visible light. Particularly recently, it is worried that the substrate (e.g., a copper film) may be damaged by irradiation of visible light, or degree of a liquid processing (e.g., an etching amount of an oxide film) may be changed by the irradiation of visible light, and thus, there is also an increasing number of cases where the liquid processing of the substrate is performed while the light is turned off. In this case, the monitoring technology disclosed in Patent Document 1 using a visible light image may not be used in the first place.

The present disclosure has been made under such circumstances and is to provide a technology capable of detecting presence/absence of an abnormality of a liquid processing, even under a situation where a substrate is not illuminated with visible light.

Means to Solve the Problem

An aspect of the present disclosure is a substrate processing apparatus including: a processing chamber; a substrate holder that is disposed in the processing chamber and holds a substrate; a processing liquid supply that supplies a processing liquid to the substrate held in the substrate holder; an infrared camera that acquires an infrared image of the processing chamber; and a controller that detects at least a state of the processing liquid based on the infrared image and monitors presence/absence of an abnormality.

Effect of the Invention

According to the present disclosure, it is possible to detect presence/absence of an abnormality, even under a situation where a substrate is not illuminated with visible light.

DETAILED DESCRIPTION TO EXECUTE THE INVENTION

Hereinafter, embodiments of the present disclosure will be described with reference to the drawings. First, descriptions will be made on a typical example of a substrate processing system to which the present disclosure may be applied.

Figure 1:
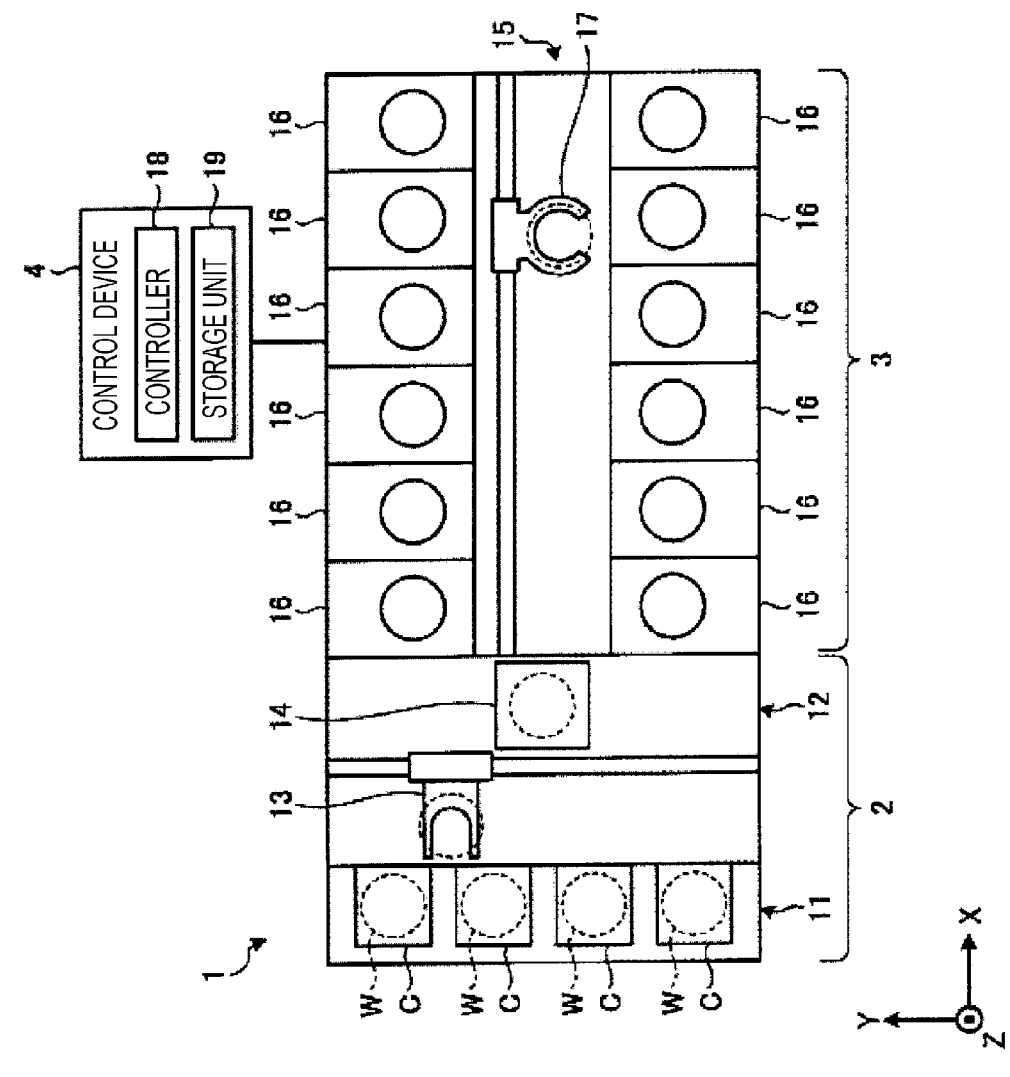
FIG. 1 is a view illustrating a schematic configuration of a substrate processing system according to an embodiment of the present disclosure.

FIG. 1 is a view illustrating a schematic configuration of a substrate processing system according to an embodiment. In the following, in order to clarify positional relationships, the X-axis, Y-axis, and Z-axis are defined as being orthogonal to each other. The positive Z-axis direction is regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C are placed to horizontally accommodate a plurality of substrates, i.e., semiconductor wafers (hereinafter, "wafers W") in the present embodiment.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 are disposed at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafer W transferred by the substrate transfer device 17.

Further, the liquid processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disk (HD), a flexible disk (FD), a compact disk (CD), a magnet optical disk (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the delivery unit 14. The wafer W placed on the delivery unit 14 is taken out from the delivery unit 14 by the substrate transfer device 17 of the processing station 3, and carried into a processing unit 16.

The wafer W carried into the processing unit 16 is processed by the processing unit 16, and then, carried out from the processing unit 16 and placed on the delivery unit 14 by the substrate transfer device 17. The processed wafer W placed on the delivery unit 14 returns to the carrier C of the carrier placing section 11 by the substrate transfer device 13.

Figure 2:
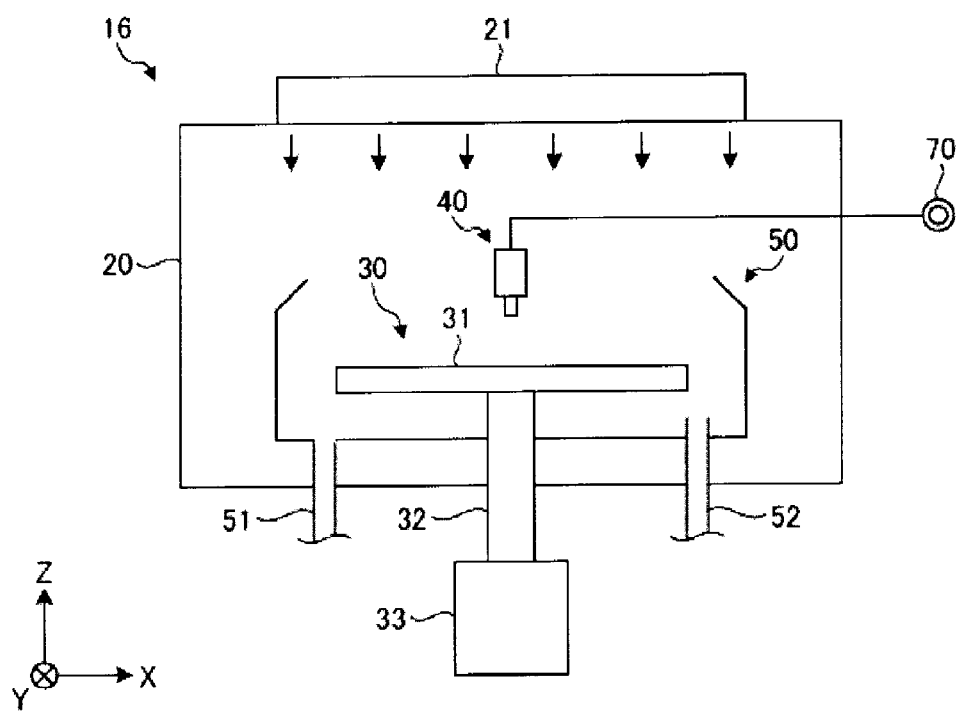
FIG. 2 is a vertical-sectional side view illustrating an outline of a processing unit.

As illustrated in FIG. 2, the processing unit 16 is provided with a chamber 20, a substrate holding mechanism 30, a processing fluid supply 40, and a recovery cup 50.

The chamber 20 accommodates the substrate holding mechanism 30, the processing fluid supply 40, and the recovery cup 50. A fan filter unit (FFU) 21 is provided on the ceiling of the chamber 20. The FFU 21 forms a downflow in the chamber 20.

The substrate holding mechanism 30 is provided with a holder 31, a column unit 32, and a driving unit 33. The holder 31 holds the wafer W horizontally. The column unit 32 is a vertically extending member, and has a base end portion supported rotatably by the driving unit 33 and a tip end portion supporting the holder 31 horizontally. The driving unit 33 rotates the column unit 32 around the vertical axis. The substrate holding mechanism 30 rotates the column unit 32 by using the driving unit 33, so that the holder 31 supported by the column unit 32 is rotated, and thus, the wafer W held in the holder 31 is rotated.

The processing fluid supply 40 supplies a processing fluid onto the wafer W. The processing fluid supply 40 is connected to a processing fluid source 70.

The recovery cup 50 is disposed to surround the holder 31, and collects the processing liquid scattered from the wafer W by the rotation of the holder 31. A drain port 51 is formed on the bottom of the recovery cup 50, and the processing liquid collected by the recovery cup 50 is released from the drain port 51 to the outside of the processing unit 16. Further, an exhaust port 52 is formed on the bottom of the recovery cup 50 to release a gas supplied from the FFU 21 to the outside of the processing unit 16.

[Infrared Camera]

As described above, the substrate processing system 1 is provided with the plurality of processing units (substrate processing apparatuses) 16, and each of the processing units 16 is provided with the chamber (processing chamber) 20, the holder (substrate holder) 31 that is disposed in the chamber 20 and holds the wafer (substrate) W, and the processing fluid supply (processing liquid supply) 40 that supplies the processing liquid to the wafer W held in the holder 31. The processing unit 16 according to the embodiment further includes an infrared camera that acquires an infrared image of the inside of the chamber 20, and the control device (controller) 4 detects at least a state of the processing liquid based on the infrared image and monitors presence/absence of an abnormality. The infrared camera 60 performs various operations such as image capturing under the control of the control device 4 (particularly, a main control unit to be described later).

Hereinafter, a typical example of abnormality monitoring using an infrared image will be described. Although a plurality of typical examples will be described below, the control device 4 may monitor the presence/absence of one type of abnormality, or may monitor the presence/absence of multiple types of abnormality.

[Monitoring of Nozzle Position]

Figure 3:
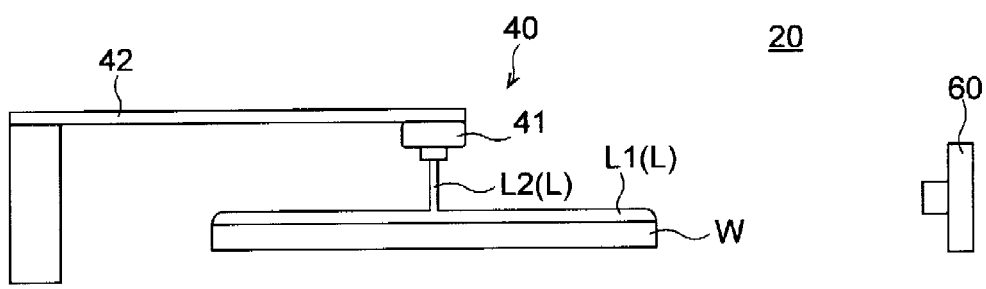
FIG. 3 is a view for explaining a first typical example of abnormality monitoring using an infrared image, and illustrates an arrangement of an infrared camera, a processing fluid supply, and a wafer.
Figure 4:
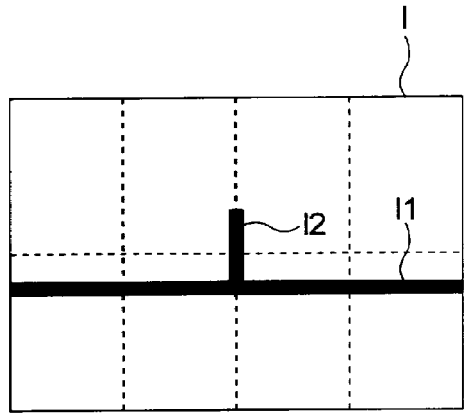
FIG. 4 is a view illustrating an example of an infrared image acquired by the infrared camera illustrated in FIG. 3.
Figure 5:
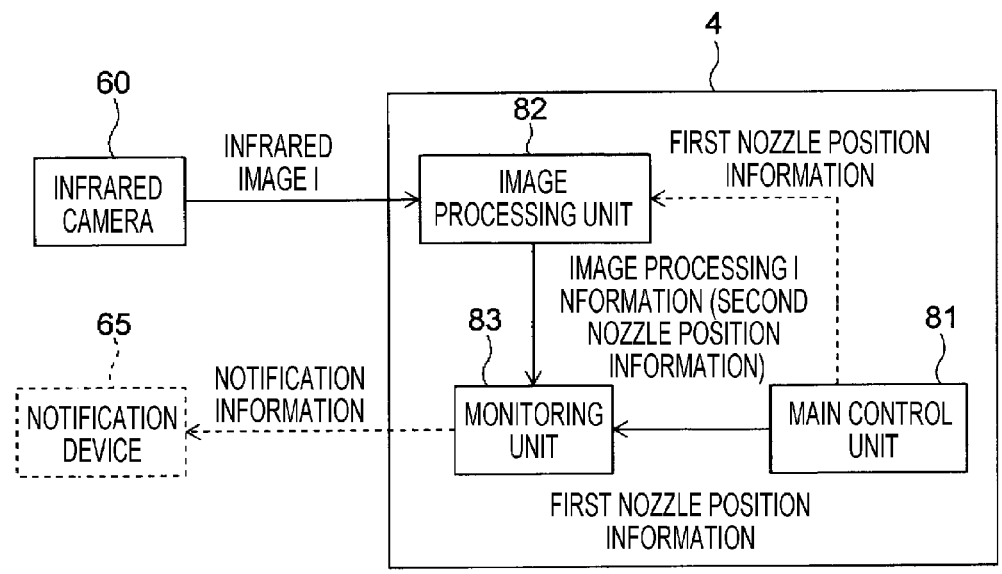
FIG. 5 is a functional block diagram of a control device according to the first typical example of the abnormality monitoring using an infrared image.

FIG. 3 is a view for explaining a first typical example of abnormality monitoring using an infrared image, and illustrates an arrangement of the infrared camera 60, the processing fluid supply 40, and the wafer W. FIG. 4 is a view illustrating an example of an infrared image I acquired by the infrared camera 60 illustrated in FIG. 3. FIG. 5 is a functional block diagram of the control device 4 according to the first typical example of the abnormality monitoring using an infrared image.

In the typical example, the presence/absence of an abnormality with respect to the position of the processing fluid supply 40 that ejects the processing liquid L is monitored by the control device 4.

The processing fluid supply 40 illustrated in FIG. 3 includes a nozzle 41, and the processing liquid L from the processing fluid source 70 is ejected from the nozzle 41. The nozzle 41 is fixedly attached to a drive arm 42, and the drive arm 42 is pivotally provided under the control of the control device 4. Therefore, the placing position of the nozzle 41 is determined in accordance with a pivot operation of the drive arm 42. For example, when the wafer W is attached to or detached from the holder 31, the drive arm 42 disposes the nozzle 41 at a position that does not interfere with the wafer W (i.e., a standby position). Meanwhile, when the processing liquid L is ejected toward the wafer W from the nozzle 41, the drive arm 42 disposes the nozzle 41 at a predetermined position (i.e., an ejection position) above the waver W, so that the processing liquid L is ejected from the nozzle 41 toward a desired position of the processing surface (i.e., the upper surface) of the wafer W.

The nozzle 41 (processing fluid supply 40) ejects the processing liquid L having a temperature higher than a temperature of the atmosphere in the chamber 20. The temperature of the processing liquid L ejected from the nozzle 41 is determined in accordance with conditions of the liquid processing (e.g., composition of the processing liquid L or composition of the wafer W), but is typically about 20° C. to about 70° C. The control device 4 monitors the presence/absence of the abnormality by detecting the state (e.g., the temperature or the position) of the processing liquid L based on the temperature difference between the processing liquid L and the atmosphere.

When the liquid processing is performed on the wafer W, the precessing liquid L is ejected toward the processing surface of the wafer W from the nozzle 41, and a liquid film L1 of the processing liquid L is formed on the processing surface, and a liquid column L2 of the processing liquid L is formed between the nozzle 41 and the liquid film L1. The infrared camera 60 captures the liquid film L1 and the liquid column L2 (particularly, the liquid column L2) formed as described above, and acquires an infrared image I as illustrated in FIG. 4.

The attaching position and the attaching aspect of the infrared camera 60 are not particularly limited as long as a desired target may be appropriately captured. In the typical example, the attaching position and the attaching aspect of the infrared camera 60 are not limited as long as the liquid film L1 and the liquid column L2 (particularly, the liquid column L2) may be appropriately captured. Further, the specific specifications of the infrared camera 60 are not particularly limited as long as the infrared image I useful for appropriately monitoring the presence/absence of the abnormality may be acquired. Therefore, the infrared camera 60 may capture a moving image, may capture a still image, or may perform so-called consecutive shot in which a plurality of still images are consecutively captured in a short time.

Further, the wavelength of the infrared rays that may be captured by the infrared camera 60 is not particularly limited. The infrared camera 60 may capture images based on a wavelength in the near infrared region, based on a wavelength in the mid infrared region, or based on a wavelength in the far infrared region, and may capture images based on the wavelengths of two or more wavelength regions among the plurality of wavelength regions, or based on the wavelengths of other infrared regions. Further, the infrared camera 60 may acquire an image obtained by analyzing the intensity of infrared rays to calculate the temperature distribution as the infrared image I. For example, a thermography that provides the infrared image I obtained by visualizing the ray amount distribution of the far infrared rays may be used as the infrared camera 60. Further, an infrared camera (e.g., a near infrared camera) that provides a monochrome image may be used as the infrared camera 60.

As is clear from FIG. 4, the infrared image I acquired by the infrared camera 60 of the typical example includes a liquid film image I1 that corresponds to the liquid film L1 of the processing liquid L and a liquid column image I2 that corresponds to the liquid column L2 of the processing liquid L, and the position of the liquid column 12 in the infrared image I may be specified. Therefore, the control device 4 specifies the position of the liquid column image 12 by performing the imaging processing on the infrared image I, and the placing position of the nozzle 41 (processing fluid supply 40) may be specified based on the position of the liquid column image 12. Meanwhile, the control device 4 acquires information on the drive position of the drive arm 42, and the placing position of the nozzle 41 (processing fluid supply 40) may be specified based on the drive position. Therefore, the control device 4 may monitor the presence/absence of the abnormality with respect to the placing position of the nozzle 41 by acquiring both the information on the placing position of the nozzle 41 obtained from the liquid column image 12 and the information on the placing position of the nozzle 41 obtained from the drive position of the drive arm 42.

As illustrated in FIG. 5 as an example, the control device 4 includes a main control unit 81, an image processing unit 82, and a monitoring unit 83.

The main control unit 81 controls the overall liquid processing. The main control unit 81 performs, for example, drive control of the drive arm 42, opening/closing control of a flow rate adjusting valve (not illustrated) that adjusts the flow rate of the processing liquid L flowing through a pipe connecting the processing fluid source 70 and the nozzle 41, and rotation control of the holder 31. As a result, the main control unit 81 includes information on the placing position of the drive arm 42, and also information (i.e., "first nozzle position information") that indicates directly or indirectly the placing position of the nozzle 41 integrally attached to the drive arm 42. The main control unit 81 provides the first nozzle position information to the monitoring unit 83.

Meanwhile, the image processing unit 82 receives the infrared image I from the infrared camera 60, acquires image processing information by performing the image processing on the infrared image I, and provided the image processing information to the monitoring unit 83. Positional information of the liquid column image 12 in the infrared image I is acquired by the image processing, and information (i.e., "second nozzle position information") that indicates directly or indirectly the placing position of the nozzle 41 is acquired from the positional information of the liquid column image 12. The image processing unit 82 provides the second nozzle position information to the monitoring unit 83.

Then, the monitoring unit 83 compares the first nozzle position information from the main control unit 81 and the second nozzle position information from the image processing unit 82, and monitors the presence/absence of the abnormality with respect to the position of the nozzle 41 (processing fluid supply 40). When there is no abnormality in the position of the nozzle 41, the first nozzle position information and the second nozzle position information indicate data that corresponds to each other. Meanwhile, when there is an abnormality in the position of the nozzle 41, the first nozzle position information and the second nozzle position information indicate data that does not correspond to each other. The monitoring unit 83 may monitor the presence/absence of the abnormality in the position of the nozzle, based on the correspondence between the first nozzle position information and the second nozzle position information.

When the presence/absence of the abnormality in the position of the nozzle is monitored as described above, the processing liquid L is ejected from the nozzle 41. As a result, the monitoring unit 83 may acquire ejection information of the processing liquid L from the main control unit 81 (will be described later), and monitor the presence/absence of the abnormality in the position of the nozzle by confirming that the ejection information is information (i.e., "ejection ON information") indicating that the processing liquid L is being ejected from the nozzle 41.

Further, the timing of performing the image processing on the infrared image I in the image processing unit 82 is not particularly limited. For example, the image processing unit 82 may perform the image processing when the first nozzle position information is provided to the image processing unit 82 from the main control unit 81, and the first nozzle position information indicates that the nozzle 41 enters a specific area (e.g., the area above the wafer W) or the nozzle 41 is disposed at a specific position (e.g., a predetermined position at which the processing liquid L is ejected toward the wafer W). That is, the infrared image I captured and acquired while the nozzle 41 is disposed in a specific area or at a specific position may be used as the image processing target. By switching the execution/non-execution of the image processing according to the position of the nozzle 41 in this way, useless image processing may be avoided and the processing load on the control device 4 may be reduced.

[Monitoring of Liquid Dripping]

Figure 6:
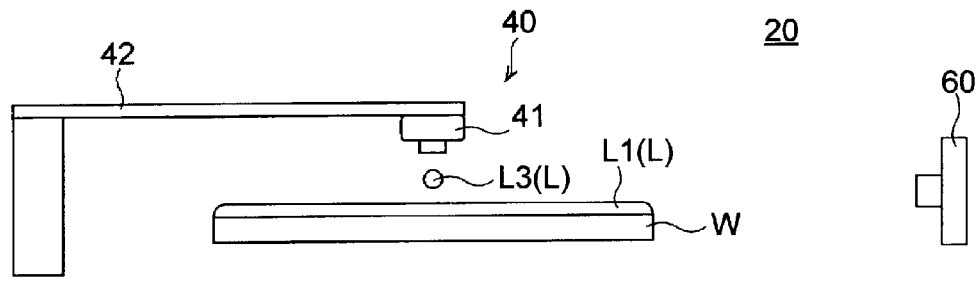
FIG. 6 is a view for explaining a second typical example of abnormality monitoring using an infrared image, and illustrates an arrangement of an infrared camera, a processing fluid supply, and a wafer.
Figure 7:
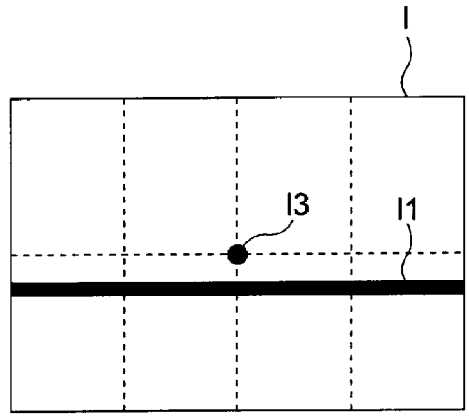
FIG. 7 is a view illustrating an example of an infrared image acquired by the infrared camera illustrated in FIG. 6.
Figure 8:
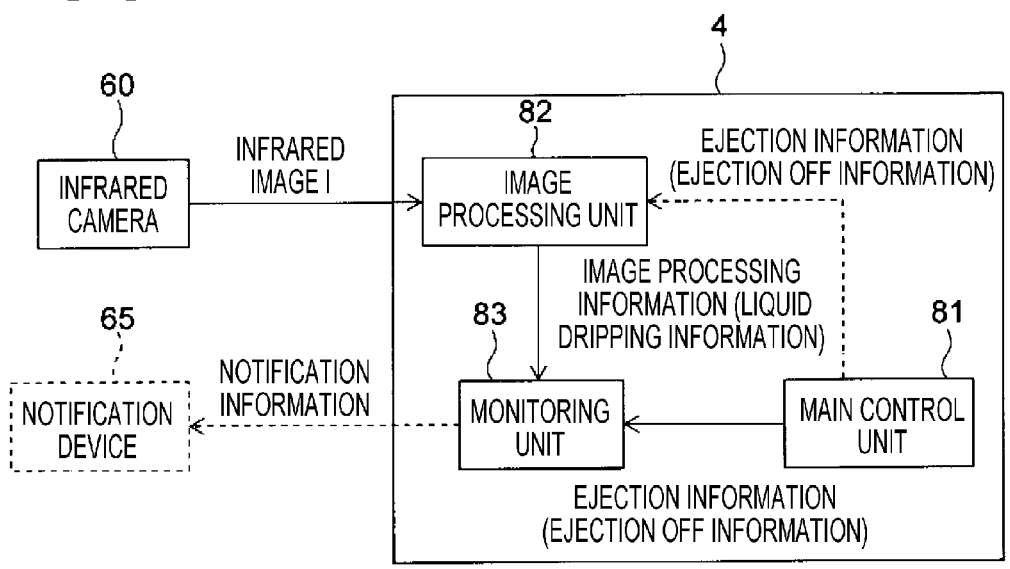
FIG. 8 is a functional block diagram of a control device according to the second typical example of the abnormality monitoring using an infrared image.

FIG. 6 is a view for explaining a second typical example of abnormality monitoring using an infrared image, and illustrates an arrangement of the infrared camera 60, the processing fluid supply 40, and the wafer W. FIG. 7 is a view illustrating an example of an infrared image I acquired by the infrared camera 60 illustrated in FIG. 6. FIG. 8 is a functional block diagram of the control device 4 according to the second typical example of the abnormality monitoring using an infrared image. The arrangement of the infrared camera 60, the processing fluid supply 40, and the wafer W according to the typical example illustrated in FIG. 6 is equal to that of the first typical example (see FIG. 3) described above. Further, the functional block diagram of the control device 4 according to the typical example illustrated in FIG. 8 is also equal to the first typical example (see FIG. 5) described above.

In the typical example, the presence/absence of an abnormality with respect to unexpected dripping of the processing liquid L from the nozzle 41 (processing fluid supply 40) is monitored by the control device 4.

The ejection state of the processing liquid L from the nozzle 41 (processing fluid supply 40) is adjusted by opening/closing the flow rate adjusting valve (not illustrated) provided between the processing fluid source 70 and the nozzle 41, under the control of the control device 4 (particularly, main control unit 81). As a result, the main control unit 81 includes information (i.e., "ejection information") indicating whether the processing liquid L is being ejected from the nozzle 41, and provides the ejection information to the monitoring unit 83.

Meanwhile, the infrared camera 60 consecutively captures, particularly, the area between the nozzle 41 and the liquid film L1 of the processing liquid L on the wafer W, while the processing liquid L is not ejected from the nozzle 41. When an unintended droplet L3 of the processing liquid L is dropped from the nozzle 41, the infrared image I acquired by the infrared camera 60 includes an image (i.e., "liquid dripping image") 13 of the droplet L3 as illustrated in FIG. 7. Meanwhile, when the processing liquid L is not ejected from the nozzle 41 and the droplet L3 is not dropped, the liquid dripping image 13 is not captured in the infrared image I acquired by the infrared camera 60.

Therefore, the image processing unit 82 of the control device 4 according to the typical example receives the infrared image I from the infrared camera 60, and performs the image processing on the infrared image I, and acquires information on the presence/absence of the liquid dripping image 13 in the infrared image I as image processing information. The image processing unit 82 provides the image processing information (liquid dripping information) to the monitoring unit 83.

Then, the monitoring unit 83 compares the liquid dripping information from the main control unit 81 and the ejection information from the image processing unit 82, and monitors the presence/absence of the liquid dripping abnormality. When there is no liquid dripping abnormality, the ejection information is ejection OFF information indicating that the ejection of the processing liquid L from the nozzle 41 is stopped, and the liquid dripping information also indicates that the infrared image I does not include the liquid dripping image 13. Meanwhile, when there is the liquid dripping abnormality, even when the ejection information is the ejection OFF information, the liquid dripping information indicates that the infrared image I includes the liquid dripping image 13. In this manner, the monitoring unit 83 may monitor the presence/absence of the abnormality with respect to the liquid dripping, based on the image processing information (liquid dripping information) and the ejection information (ejection OFF information).

Further, the timing of performing the image processing on the infrared image I in the image processing unit 82 is not particularly limited. For example, the image processing unit 82 may perform the image processing while the ejection information (particularly ejection OFF information) is also provided to the image processing unit 82 from the main control unit 81, and the processing liquid L is not being ejected from the nozzle 41. That is, the infrared image I captured and acquired while the processing liquid L is not being ejected from the nozzle 41 may be used as the image processing target. By switching the execution/non-execution of the image processing according to the ejection state of the processing liquid L from the nozzle 41 in this way, useless image processing may be avoided.

[Monitoring of Liquid Splash]

Figure 9:
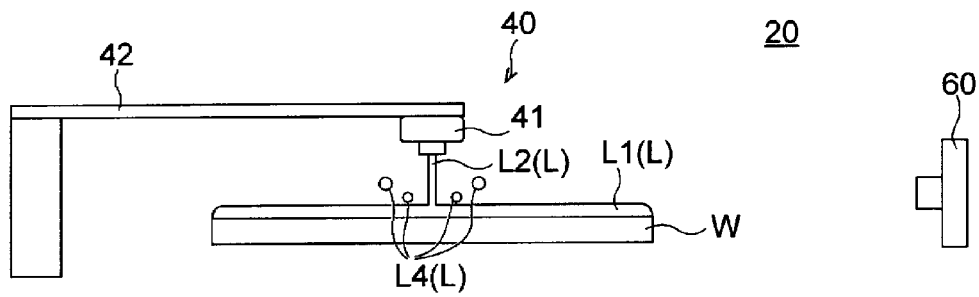
FIG. 9 is a view for explaining a third typical example of abnormality monitoring using an infrared image, and illustrates an arrangement of an infrared camera, a processing fluid supply, and a wafer.
Figure 10:
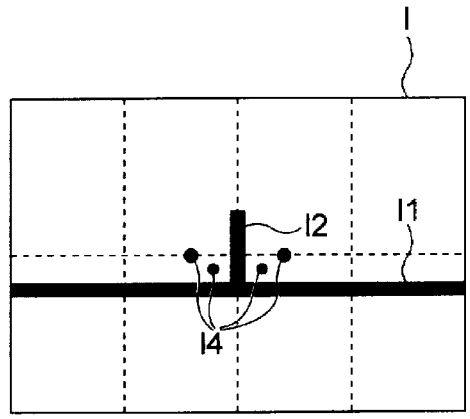
FIG. 10 is a view illustrating an example of an infrared image acquired by the infrared camera illustrated in FIG. 9.
Figure 11:
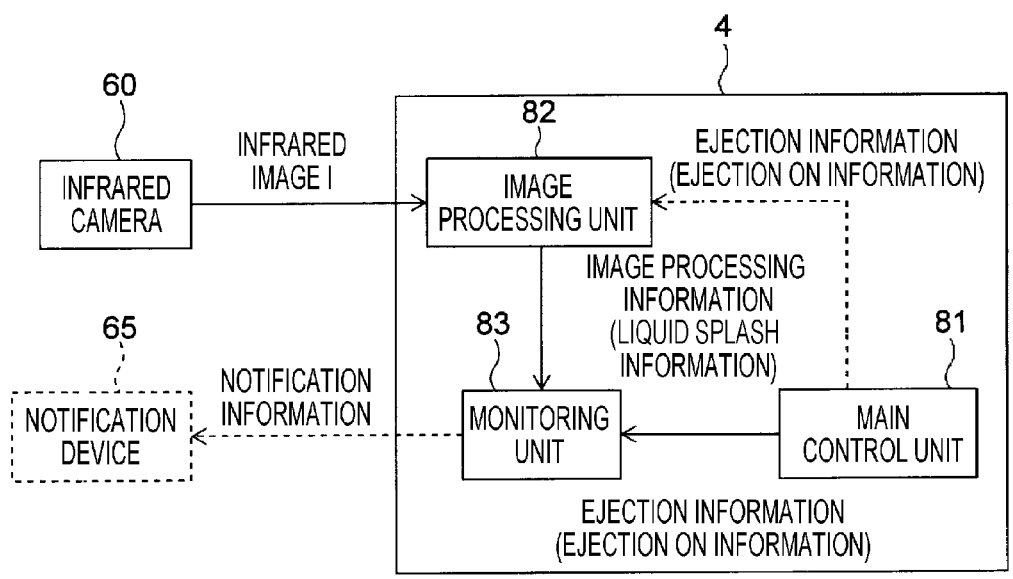
FIG. 11 is a functional block diagram of a control device according to the third typical example of the abnormality monitoring using an infrared image.

FIG. 9 is a view for explaining a third typical example of abnormality monitoring using an infrared image, and illustrates an arrangement of the infrared camera 60, the processing fluid supply 40, and the wafer W. FIG. 10 is a view illustrating an example of an infrared image I acquired by the infrared camera 60 illustrated in FIG. 9. FIG. 11 is a functional block diagram of the control device 4 according to the third typical example of the abnormality monitoring using an infrared image. The arrangement of the infrared camera 60, the processing fluid supply 40, and the wafer W according to the typical example illustrated in FIG. 9 is equal to that of the first typical example (see FIG. 3) and that of the second typical example (see FIG. 6) described above. Further, the functional block diagram of the control device 4 according to the typical example illustrated in FIG. 11 is also equal to the first typical example (see FIG. 5) and the second typical example (see FIG. 8) described above.

In the typical example, the presence/absence of an abnormality with respect to unexpected splash of the processing liquid L is monitored by the control device 4. When the processing liquid L ejected from the nozzle 41 collides with the processing liquid L forming the liquid film L1 on the wafer W, spray L4 of the processing liquid L may be generated. In the typical example, the presence/absence of an abnormality with respect to the splash of the processing liquid L is monitored by detecting the presence/absence of the generation of the spray L4.

The main control unit 81 in the typical example provides the ejection information indicating whether the processing liquid L is being ejected from the nozzle 41 to the monitoring unit 83, similarly to the main control unit 81 in the second typical example described above.

Meanwhile, the infrared camera 60 consecutively captures, particularly, the area near an intersection of the liquid column L2 and the liquid film L1, while the processing liquid L is being ejected from the nozzle 41. When unintended spray L4 of the processing liquid L is generated, the infrared image I acquired by the infrared camera 60 includes an image (i.e., "liquid splash image") 14 of the spray L4 as illustrated in FIG. 10. Meanwhile, when the spray L4 is not generated, the liquid splash image 14 is not captured in the infrared image I acquired by the infrared camera 60.

The image processing unit 82 of the control device 4 receives the infrared image I from the infrared camera 60, and performs the image processing on the infrared image I, and acquires information on the presence/absence of the liquid splash image 14 in the infrared image I as image processing information. The image processing unit 82 provides the image processing information (liquid splash information) to the monitoring unit 83.

The monitoring unit 83 compares the liquid splash information from the main control unit 81 and the ejection information from the image processing unit 82, and monitors the presence/absence of the liquid splash abnormality. When there is no liquid splash abnormality, the ejection information is ejection ON information indicating that the processing liquid L is being ejected from the nozzle 41, and the liquid splash information also indicates that the infrared image I does not include the liquid splash image 14. Meanwhile, when there is the liquid splash abnormality, even when the ejection information is the ejection ON information, the liquid splash information indicates that the infrared image I includes the liquid splash image 14. In this manner, the monitoring unit 83 may monitor the presence/absence of the abnormality with respect to the liquid splash, based on the image processing information (liquid splash information) and the ejection information.

Further, the timing of performing the image processing on the infrared image I in the image processing unit 82 is not particularly limited. For example, the image processing unit 82 may perform the image processing while the ejection information (particularly ejection ON information) is also provided to the image processing unit 82 from the main control unit 81, and the processing liquid L is being ejected from the nozzle 41. That is, the infrared image I captured and acquired while the processing liquid L is being ejected from the nozzle 41 may be used as the image processing target. By switching the execution/non-execution of the image processing according to the ejection state of the processing liquid L from the nozzle 41 in this way, useless image processing may be avoided.

[Monitoring of Liquid Film Temperature and Monitoring of Wafer Temperature]

Figure 12:
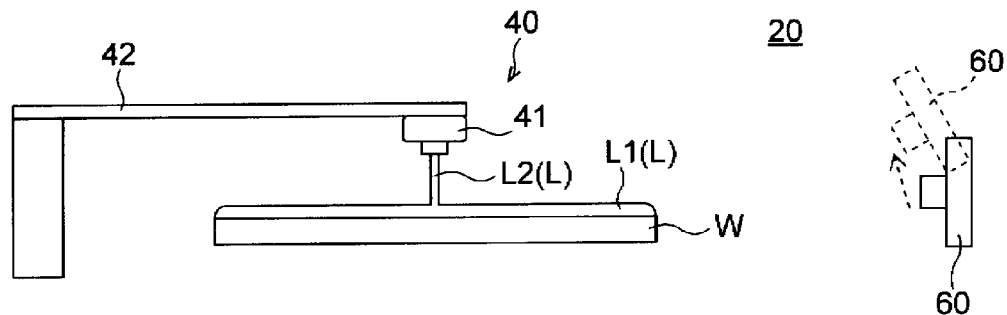
FIG. 12 is a view for explaining a fourth typical example of abnormality monitoring using an infrared image, and illustrates an arrangement of an infrared camera, a processing fluid supply, and a wafer.

FIG. 12 is a view for explaining a fourth typical example of abnormality monitoring using an infrared image, and illustrates an arrangement of the infrared camera 60, the processing fluid supply 40, and the wafer W.

The infrared camera 60 may be movably provided under the control of the control device 4, and the capturing position and/or the capturing angle of the infrared camera 60 may be variable. Therefore, the control device 4 may monitor a plurality of locations in the chamber 20 with the single infrared camera 60. For example, even in a case where it is difficult for the infrared camera 60 to capture the nozzle 41 and the entire processing surface of the wafer W simultaneously, when the infrared camera 60 is disposed at a first position (see the infrared camera 60 illustrated by a solid line in FIG. 12), the infrared camera 60 may capture the processing liquid L from the nozzle 41, and when the infrared camera 60 is disposed at a second position (see the infrared camera 60 illustrated by a broken line in FIG. 12), the infrared camera 60 may capture the liquid film L1 over the entire processing surface of the wafer W or the entire processing surface of the wafer W.

Therefore, the control device 4 according to the typical example may, for example, monitor the presence/absence of the abnormality described as the first typical example to the third typical example (see FIGS. 3 to 11) described above, and monitor the presence/absence of an abnormality with respect to the temperature of the processing liquid L on the wafer W using the common infrared camera 60. Therefore, the control device 4 may, for example, detect whether the liquid film L1 has an appropriate temperature for the liquid processing, and thus, may monitor the presence/absence of an abnormality with respect to the progress of the liquid processing.

Further, the control device 4 according to the typical example may detect the temperature of the wafer W based on the infrared image I acquired by the infrared camera 60, and monitor the presence/absence of the abnormality based on the temperature of the wafer W. Therefore, for example, the suitability of spin dry drying of the wafer W may be monitored. The spin dry drying is a processing in which the wafer W is rotated by the holder 31 in a state where the ejection of the processing liquid L from the nozzle 41 is stopped, and liquid such as the processing liquid L on the wafer W is evaporated so as to dry the wafer W. Due to the vaporization heat of the processing liquid L, the temperature of the wafer W decreases as the spin dry drying progresses. Therefore, it is possible to monitor accurately whether the wafer W is completely dried by detecting the change over time in the temperature of the wafer W or the temperature of the processing liquid L on the wafer W based on the infrared image I acquired by the infrared camera 60. The control device 4 may perform controls such as continuing the spin dry drying as necessary while the monitoring result indicates that the processing surface of the wafer W is not completely dried.

As described above, when the temperature itself of the processing liquid L and/or the wafer W is monitored, the infrared image I acquired by the infrared camera 60 needs to include such specific temperature information. Therefore, it is required to use, as the infrared camera 60, an infrared image capturing device such as a thermography capable of providing an infrared image I capable of identifying a specific temperature with a certain degree of accuracy.

Further, in the above descriptions, the case where the movable infrared camera 60 as illustrated in FIG. 12 is used has been described, the infrared camera 60 may not be movable as long as the entire desired monitoring area (e.g., the nozzle 41 and the entire processing surface of the wafer W) may be simultaneously captured. For example, a fixed infrared camera 60 capable of performing wide-angle photographing may be used, or a plurality of fixed infrared cameras 60 may be used in combination.

[Monitoring of Ejection Time of Processing Liquid]

As described above, the infrared camera 60 may capture the state of the ejection of the processing liquid L from the nozzle 41 (processing fluid supply 40). Therefore, the control device 4 (image processing unit 82) may acquire information on the ejection start time of the processing liquid L from the nozzle 41, and information on the ejection stop time of the processing liquid L from the nozzle 41, by performing the image processing on the infrared image I (e.g., a moving image) consecutively acquired by the infrared camera 60. Further, the control device 4 (image processing unit 82 or monitoring unit 83) may acquire information (i.e., "first ejection time information") on the time during which the processing liquid L is being ejected from the nozzle 41, from the ejection start time information and the ejection stop time information.

Meanwhile, the monitoring unit 83 may acquire information (i.e., "second ejection time information") on a predetermined ejection time of the processing liquid L from the nozzle 41 as recipe information, from the storage unit 19 or other functional blocks (e.g., the main control unit 81).

Then, the monitoring unit 83 may monitor the presence/absence of an abnormality in the ejection time of the processing liquid L from the nozzle 41, by comparing the first ejection time information and the second ejection time information. When there is an abnormality in the ejection time of the processing liquid L from the nozzle 41, for example, the monitoring unit 83 and the main control unit 81 may adjust the opening/closing timing of the flow rate adjusting valve (not illustrated) provided between the processing fluid source 70 and the nozzle 41, and may change the ejection start timing of the processing liquid L from the nozzle 41 and/or the ejection stop timing of the processing liquid L from the nozzle 41. Alternatively, the control device 4 may correct the recipe information.

[Monitoring of Abnormality by Comparing Among a Plurality of Processing Units]

The substrate processing system 1 according to the embodiment includes a plurality of processing units 16 (including the chambers 20), and each of the processing units 16 is partitioned by the chambers 20, and each of the chambers 20 is provided with the holder 31, the processing fluid supply 40, and the infrared camera 60.

The control device 4 (particularly the monitoring unit 83) may monitor the presence/absence of the abnormality in each processing unit 16 derived by comparing the states of the processing liquid L detected based on the infrared images I acquired by the plurality of infrared cameras 60 provided in each of the plurality of chambers 20 (the plurality of processing units 16).

For example, a flow meter (not illustrated) may be provided for each processing unit 16, and the flow rate of the processing liquid L supplied to the nozzle 41 (processing fluid supply 40) of each of the processing units 16 from the processing fluid source 70 (see FIG. 2) may be measured by the flow meter. The control device 4 (e.g., main control unit 81) may control, for example, the above described flow rate adjusting valve (not illustrated) to adjust the flow rate of the processing liquid L to the nozzle 41 of each processing unit 16. In this case, when the temperature of the processing liquid L ejected from the nozzle 41 of one processing unit 16 (hereinafter, referred to as a "abnormal processing unit 16a") is lower than the temperature of the processing liquid L ejected from the nozzle 41 of other processing units 16, it is highly probable that the amount of the processing liquid L supplied to the nozzle 41 of the abnormal processing unit 16a from the processing fluid source 70 is smaller than an assumption. In this case, there is a possibility that a problem occurs in the flow meter that measures the flow rate of the processing liquid L supplied to the nozzle 41 of the abnormal processing unit 16a from the processing fluid source 70. Therefore, it is possible to monitor the presence/absence of an abnormality with respect to the flow meter by comparing the temperature of the processing liquid L ejected from the nozzle 41 among the processing units 16.

In this manner, the abnormality that may occur in each processing unit 16 may be monitored by detecting the states such as the temperature of the processing liquid L in each of the processing units 16, and comparing the states of the processing liquid L with each other among the processing units 16.

[Monitoring Other Abnormalities]

The control device 4 may monitor abnormalities other than those described above, based on the infrared image I.

As described above, when the ejection amount of the processing liquid L from the nozzle 41 is smaller than an assumption, the temperature of the processing liquid L ejected from the nozzle 41 tends to be lower than an assumption. Therefore, the control device 4 may monitor the presence/absence of an abnormality with respect to the ejection amount of the processing liquid L by comparing the temperature of the processing liquid L (e.g., the liquid column L2 or the liquid film L1) ejected from the nozzle 41 detected based on the infrared image I and the assumption temperature of the processing liquid L preset as the recipe information.

Further, the control device 4 may monitor the presence/absence of an abnormality with respect to the supply/exhaust state (e.g., the state of the gas supplied from the FFU 21) around the outer periphery of the wafer W by detecting the temperature of the processing liquid L on the outer periphery of the wafer W and/or the temperature of the wafer W itself, based on the infrared image I. For example, as the exhaust amount through the exhaust port 52 increases, the temperature of the outer periphery of the wafer W tends to be lower than the temperature of the central portion. Therefore, the control device 4 may monitor the presence/absence of an abnormality in the exhaust by detecting the temperature distribution of the processing liquid L (liquid film L1) on the processing surface of the wafer W or the temperature distribution of the wafer W, based on the infrared image I.

Although one nozzle 41 and one drive arm 42 are illustrated in FIGS. 2, 3, 6, 9, and 12 described above, the number of the nozzles 41 and the drive arms 42 provided in each processing unit 16 may be one, or may be two or more.

Figure 13:
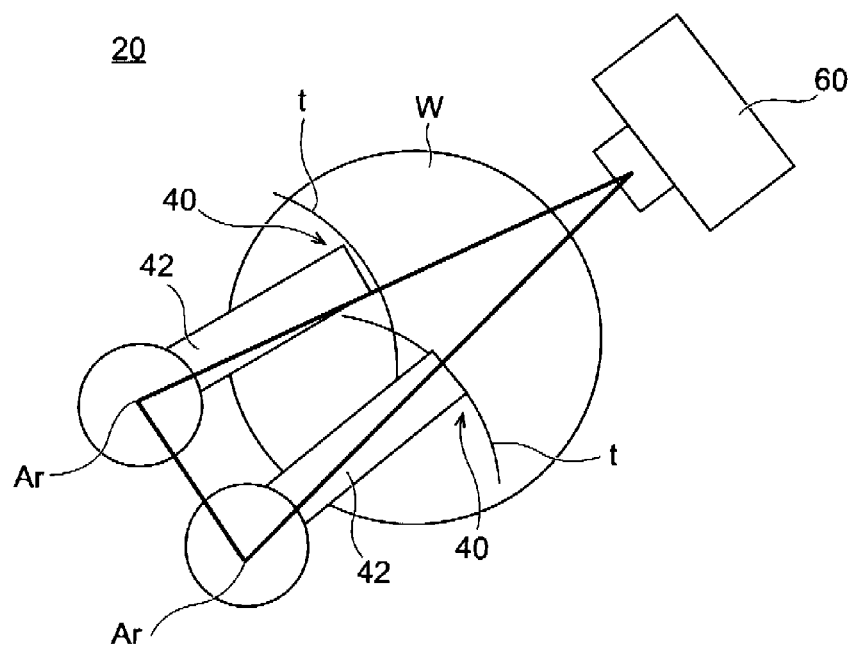
FIG. 13 is a schematic plan view illustrating an example in which two processing fluid supplies and one infrared camera are provided in one chamber.

FIG. 13 is a schematic plan view illustrating an example in which two processing fluid supplies 40 and one infrared camera 60 are provided in one chamber 20, and each processing fluid supply 40 is attached to the corresponding drive arm 42. The attaching position and the attaching aspect of the infrared camera 60 are not particularly limited, but the infrared camera 60 may be provided at a position and at an angle where the entire moving path t (particularly, the moving path t above the wafer W) of the processing fluid supplies 40 on the wafer W may be captured simultaneously. When the respective processing fluid supplies 40 and the respective drive arm 42 have the same structure, the infrared camera 60 may be provided at a position equidistant from the rotation axis Ar of the drive arms 42.

The common infrared camera 60 is assigned to the plurality of processing fluid supplies 40 in FIG. 13, but unique infrared camera 60 may be assigned to each processing fluid supply 40. Further, a plurality of infrared cameras 60 may be assigned to one processing fluid supply 40.

[Example of Processing of Monitoring Result]

As described above, the control device 4 may monitor the presence/absence of various types of abnormalities by performing the image processing on the infrared image I of the infrared camera 60. The control device 4 may process the monitoring result of these abnormalities.

For example, the control device 4 may record information on the presence/absence of the abnormality in the storage unit 19. In this case, the control device 4 may record information on the date and time when the presence/absence of the abnormality is monitored, identification information of the wafer W on which the monitoring is performed, and/or other related information in the storage unit 19 in association with the information on the presence/absence of the abnormality. Therefore, a user or an arbitrary device may access the storage unit 19 as necessary, and retrieve the information on the presence/absence of the abnormality.

Further, the control device 4 may record, when performing the monitoring of the presence/absence of the abnormality, the ejection start time information indicating the time at which the ejection of the processing liquid L from the processing fluid supply 40 starts, and the ejection stop time information indicating the time at which the ejection of the processing liquid L from the processing fluid supply 40 stops in the storage unit 19 as information on the presence/absence of the abnormality. In this case, the control device 4 may control the ejection time during which the processing liquid L is ejected from the processing fluid supply 40, based on the ejection start time information and the ejection stop time information recorded in the storage unit 19, and perform optimization of the ejection time of the processing liquid L.

Further, a notification device 65 (see FIGS. 5, 8, and 11) connected to the control device 4 (e.g., the monitoring unit 83) is further provided, and when an abnormality is detected, the control device 4 (e.g., the monitoring unit 83) may operate the notification device 65 to notify a user of the abnormality. The notification device 64 may be configured by any devices. For example, the notification device 65 may be configured by a display device and/or a sound device, and may notify the presence/absence of the abnormality by a display or sound.

Further, when an abnormality is detected, the control device 4 may control various devices so as to correct the abnormality. For example, when a positional deviation abnormality of the nozzle 41 (processing fluid supply 40) is detected, the control device 4 may automatically optimize the position of the nozzle 41 by controlling the drive arm 42, based on the position information of the nozzle 41 obtained from the infrared image I.

The present disclosure is not limited to the above described embodiments and modified examples, and may include various aspects to which various modifications that may be conceived by those skilled in the art are added. The effects achieved by the present disclosure are not limited to the above descriptions. Therefore, various additions, changes, and partial deletions may be made to each element described in the claims and the specification without departing from the technical concept or spirit of the present disclosure.

For example, the above described control device 4 includes the main control unit 81, the image processing unit 82, and the monitoring unit 83 (see FIGS. 5, 8, and 11). However, the control device 4 may functionally include each of these units, and the functions of the respective units may be implemented by appropriately combining hardware and software.

Further, in addition to the substrate processing apparatus, the present disclosure may be implemented as a substrate processing method, a program for causing a computer to execute the procedure performed in such a substrate processing method and a non-transitory computer readable recording medium in which such a program is recorded, and other objects and methods.

DESCRIPTION OF SYMBOLS

4: control device
16: processing unit
20: chamber
31: holder
40: processing fluid supply
41: nozzle
60: infrared camera
L: processing liquid
W: wafer

What is claimed is:

1. A substrate processing apparatus comprising:
a processing chamber;
a substrate holder disposed in the processing chamber and configured to hold a substrate;
a processing liquid supply configured to supply a processing liquid to the substrate held in the substrate holder;
an infrared camera configured to acquire an infrared image of the processing chamber; and
a controller configured to detect at least a state of the processing liquid based on the infrared image and monitor presence/absence of an abnormality;
wherein a plurality of processing chambers is provided,
the substrate holder, the processing liquid supply, and the infrared camera are provided for each of the plurality of processing chambers, and
the presence/absence of an abnormality includes presence/absence of an abnormality derived by comparing states of the processing liquid with each other detected based on infrared images acquired by the infrared cameras provided in the plurality of processing chambers, respectively.

2. The substrate processing apparatus according to claim 1, wherein the processing liquid supply ejects the processing liquid having a temperature higher than an atmospheric temperature in the processing chamber, and the controller detects the state of the processing liquid based on a temperature difference between the processing liquid and the atmospheric temperature.

3. The substrate processing apparatus according to claim 1, wherein the presence/absence of an abnormality includes presence/absence of an abnormality with respect to a position of the processing liquid supply that ejects the processing liquid.

4. The substrate processing apparatus according to claim 1, wherein the presence/absence of an abnormality includes presence/absence of an abnormality with respect to unexpected dripping of the processing liquid from the processing liquid supply.

5. The substrate processing apparatus according to claim 1, wherein the presence/absence of an abnormality includes presence/absence of an abnormality with respect to unexpected splash of the processing liquid.

6. The substrate processing apparatus according to claim 1, wherein the presence/absence of an abnormality includes presence/absence of an abnormality with respect to temperature of the processing liquid on the substrate.

7. The substrate processing apparatus according to claim 1, wherein the controller also detects temperature of the substrate based on the infrared image and monitors the presence/absence of an abnormality.

8. The substrate processing apparatus according to claim 1, wherein the controller records information on the presence/absence of an abnormality, in a storage.

9. The substrate processing apparatus according to claim 8, wherein the controller records ejection start time information indicating when the ejection of the processing liquid from the processing liquid supply starts, and ejection stop time information indicating when the ejection of the processing liquid from the processing liquid supply stops, in the storage as information on the presence/absence of an abnormality.

10. The substrate processing apparatus according to claim 9, wherein the controller controls an ejection time at which the processing liquid is ejected from the processing liquid supply, based on the ejection start time information and the ejection stop time information.

11. The substrate processing apparatus according to claim 1, further comprising a notification device,
wherein, when an abnormality is detected, the controller operates the notification device to notify a user of the abnormality.

12. A substrate processing apparatus comprising:
a processing chamber;
a substrate holder disposed in the processing chamber and configured to hold a substrate;
a processing liquid supply configured to supply a processing liquid to the substrate held in the substrate holder;
an infrared camera configured to acquire an infrared image of the processing chamber; and
a controller configured to detect at least a state of the processing liquid based on the infrared image and monitor presence/absence of an abnormality;
wherein the controller records information on the presence/absence of an abnormality, in a storage, and
wherein the controller records ejection start time information indicating when the ejection of the processing liquid from the processing liquid supply starts, and ejection stop time information indicating when the ejection of the processing liquid from the processing liquid supply stops, in the storage as information on the presence/absence of an abnormality.

13. The substrate processing apparatus according to claim 12, wherein the processing liquid supply ejects the processing liquid having a temperature higher than an atmospheric temperature in the processing chamber, and
the controller detects the state of the processing liquid based on a temperature difference between the processing liquid and the atmospheric temperature.

14. The substrate processing apparatus according to claim 12, wherein the presence/absence of an abnormality includes presence/absence of an abnormality with respect to unexpected dripping of the processing liquid from the processing liquid supply.

15. The substrate processing apparatus according to claim 12, wherein the presence/absence of an abnormality includes presence/absence of an abnormality with respect to unexpected splash of the processing liquid.

16. The substrate processing apparatus according to claim 12, wherein the presence/absence of an abnormality includes presence/absence of an abnormality with respect to temperature of the processing liquid on the substrate.

17. The substrate processing apparatus according to claim 12, wherein the presence/absence of an abnormality includes presence/absence of an abnormality with respect to a position of the processing liquid supply that ejects the processing liquid.

18. The substrate processing apparatus according to claim 12, wherein the controller also detects temperature of the substrate based on the infrared image and monitors the presence/absence of an abnormality.

19. The substrate processing apparatus according to claim 12, wherein a plurality of processing chambers is provided,
the substrate holder, the processing liquid supply, and the infrared camera are provided for each of the plurality of processing chambers, and
the presence/absence of an abnormality includes presence/absence of an abnormality derived by comparing states of the processing liquid with each other detected based on infrared images acquired by the infrared cameras provided in the plurality of processing chambers, respectively.

20. The substrate processing apparatus according to claim 12, wherein the controller controls an ejection time at which the processing liquid is ejected from the processing liquid supply, based on the ejection start time information and the ejection stop time information.

21. The substrate processing apparatus according to claim 12, further comprising a notification device,
wherein, when an abnormality is detected, the controller operates the notification device to notify a user of the abnormality.

* * * * *